United States Patent
Anderson et al.

(10) Patent No.: US 9,350,391 B1
(45) Date of Patent: *May 24, 2016

(54) SYSTEM AND METHOD FOR DYNAMIC SCALING OF LDPC DECODER IN A SOLID STATE DRIVE

(71) Applicant: Western Digital Technologies, Inc., Irvine, CA (US)

(72) Inventors: Kent D. Anderson, Broomfield, CO (US); Anantha Raman Krishnan, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/722,673

(22) Filed: May 27, 2015

Related U.S. Application Data

(63) Continuation of application No. 13/842,956, filed on Mar. 15, 2013, now Pat. No. 9,059,742.

(51) Int. Cl.
   *G06F 11/10* (2006.01)
   *H03M 13/37* (2006.01)
   *G11C 29/52* (2006.01)
   *H03M 13/45* (2006.01)
   *H03M 13/11* (2006.01)

(52) U.S. Cl.
   CPC ....... *H03M 13/3746* (2013.01); *G06F 11/1068* (2013.01); *G11C 29/52* (2013.01); *H03M 13/1111* (2013.01); *H03M 13/1128* (2013.01); *H03M 13/45* (2013.01)

(58) Field of Classification Search
   CPC .................................................. G06F 11/1076
   USPC .................. 714/773, 758, 755, 752, 759, 807
   See application file for complete search history.

(56) References Cited

U.S. PATENT DOCUMENTS

| | | | |
|---|---|---|---|
| 4,596,024 A * | 6/1986 | Thomson | 375/347 |
| 6,856,556 B1 | 2/2005 | Hajeck | |
| 7,126,857 B2 | 10/2006 | Hajeck | |
| 7,188,282 B2 | 3/2007 | Walmsley | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,600,172 B2 | 10/2009 | Berens et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |

(Continued)

*Primary Examiner* — Fritz Alphonse
(74) *Attorney, Agent, or Firm* — McDermott Will & Emery LLP

(57) ABSTRACT

In some embodiments of the present invention, a data storage device includes a controller and a memory. The data storage device further includes an LDPC encoder and decoder, with the decoder implementing a dynamic precision-rescaling technique for improving performance. In one embodiment, the technique works by rescaling the binary representations of the input log-likelihood ratios (LLRs) and messages upon activation of decoder-state-based triggers. Various triggering functions are introduced, e.g., checking if the number of output LLRs smaller than a certain limit crosses a threshold, checking if the weight of a syndrome crosses a threshold, etc. This technique offers an improvement in the performance of the decoder.

12 Claims, 5 Drawing Sheets

(56) References Cited

U.S. PATENT DOCUMENTS

| | | |
|---|---|---|
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,086,940 B2 | 12/2011 | Yousef |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,122,314 B1 | 2/2012 | Yang et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,745,277 B2 | 6/2014 | Kan |
| 9,059,742 B1 | 6/2015 | Anderson et al. |
| 2005/0160316 A1 | 7/2005 | Shipton |
| 2007/0234178 A1* | 10/2007 | Richardson et al. .......... 714/758 |
| 2010/0042905 A1 | 2/2010 | Gunnam et al. |
| 2010/0042906 A1 | 2/2010 | Gunnam et al. |
| 2010/0107030 A1 | 4/2010 | Graef |
| 2010/0174849 A1 | 7/2010 | Walston et al. |
| 2010/0250793 A1 | 9/2010 | Syu |
| 2011/0099323 A1 | 4/2011 | Syu |
| 2011/0258508 A1 | 10/2011 | Ivkovic et al. |
| 2011/0283049 A1 | 11/2011 | Kang et al. |
| 2012/0033320 A1 | 2/2012 | Tan et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0115427 A1 | 4/2014 | Lu |
| 2014/0133220 A1 | 5/2014 | Danilak et al. |
| 2014/0136753 A1 | 5/2014 | Tomlin et al. |

\* cited by examiner

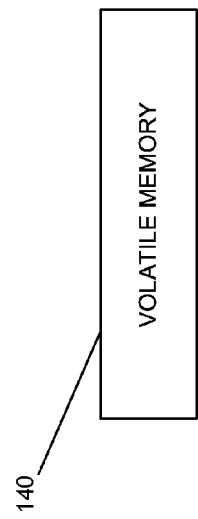
FIGURE 1C
VOLATILE MEMORY
FIGURE 1D
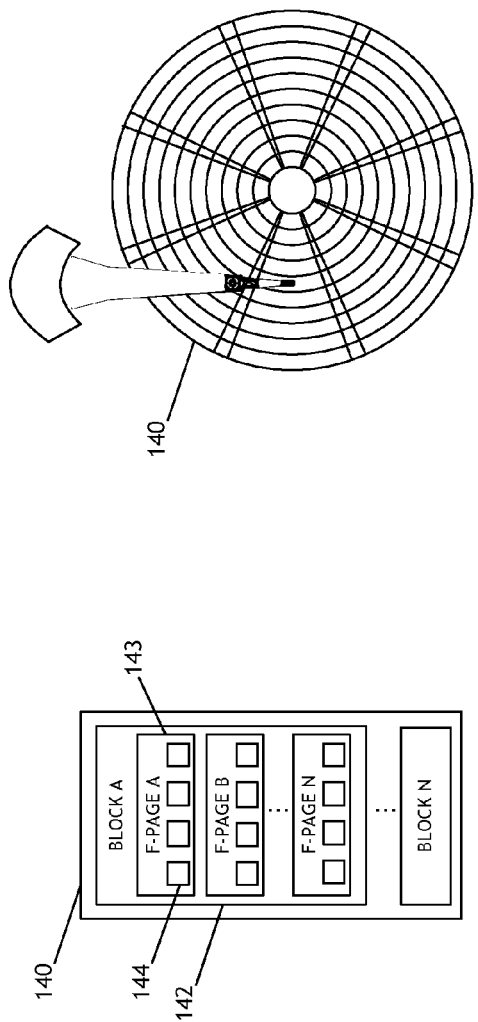
FIGURE 1B

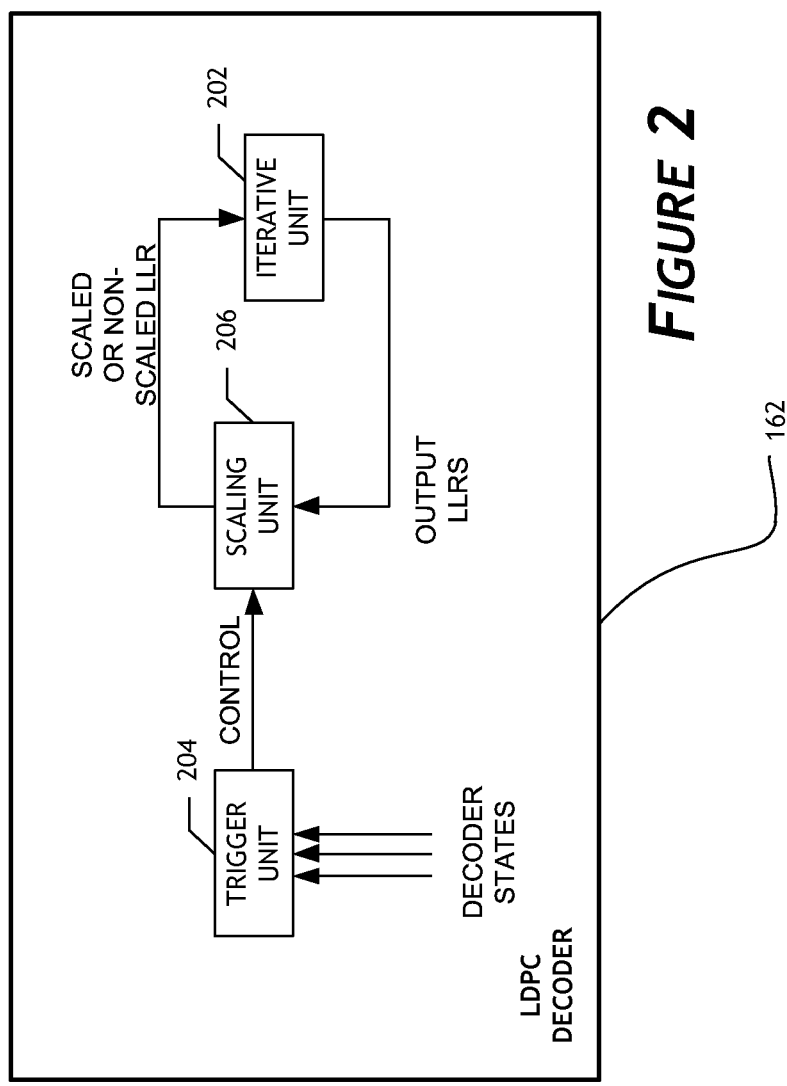

US 9,350,391 B1

SYSTEM AND METHOD FOR DYNAMIC SCALING OF LDPC DECODER IN A SOLID STATE DRIVE

CROSS REFERENCE TO RELATED APPLICATIONS

This application is a continuation of U.S. patent application Ser. No. 13/842,956, filed on Mar. 15, 2013, which is hereby incorporated by reference in its entirety.

BACKGROUND

1. Technical Field

This disclosure relates to data storage devices for computer systems. More particularly, the disclosure relates to dynamical scaling in a decoder in a data storage device.

2. Description of the Related Art

Both volatile and non-volatile memory can introduce errors in the stored data. To protect user data stored in memory from corruption, parity data can be determined and stored along with user data to facilitate error detection and/or correction. Low Density Parity Code (LDPC) is becoming an increasingly common way for providing error correction.

BRIEF DESCRIPTION OF THE DRAWINGS

Systems and methods that embody the various features of the invention will now be described with reference to the following drawings, in which:

FIGS. 1B-1D illustrate the various types of memory that could be present in the data storage device in some embodiments.

FIG. 2 is a simplified block diagram illustrating a dynamic scaling mechanism in a decoder according to one embodiment of the invention.

DETAILED DESCRIPTION OF SPECIFIC EMBODIMENTS

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

In some embodiments, "coding" or "to code" data as used in this disclosure refer to the process of encoding data and/or the process of decoding data.

Overview

In some embodiments of the present invention, a data storage device includes a controller and a memory, which may include (1) non-volatile memory such as solid-state memory (e.g., NAND) and magnetic media commonly used in hard disk drives, (2) volatile memory such as a random access memory (e.g., DRAM, SRAM), or (3) a mix of both non-volatile and volatile memory. The data storage device further includes an LDPC encoder and decoder, with the decoder implementing a dynamic precision-rescaling technique for improving performance. In one embodiment, the technique works by rescaling the binary representations of the input log-likelihood ratios (LLRs) and messages upon activation of decoder-state-based triggers. Messages can be broadly defined as a scalar of an estimated reliability representing a single unit of data (typically in a binary case) or a vector of an estimated reliability representing a single unit of data (typically in a non-binary case). Various triggering functions are introduced, e.g., checking if the number of output LLRs smaller than a certain limit crosses a threshold, checking if the weight of a syndrome crosses a threshold, etc. This technique offers an improvement in the performance of the decoder.

System Overview

Figure 1A:
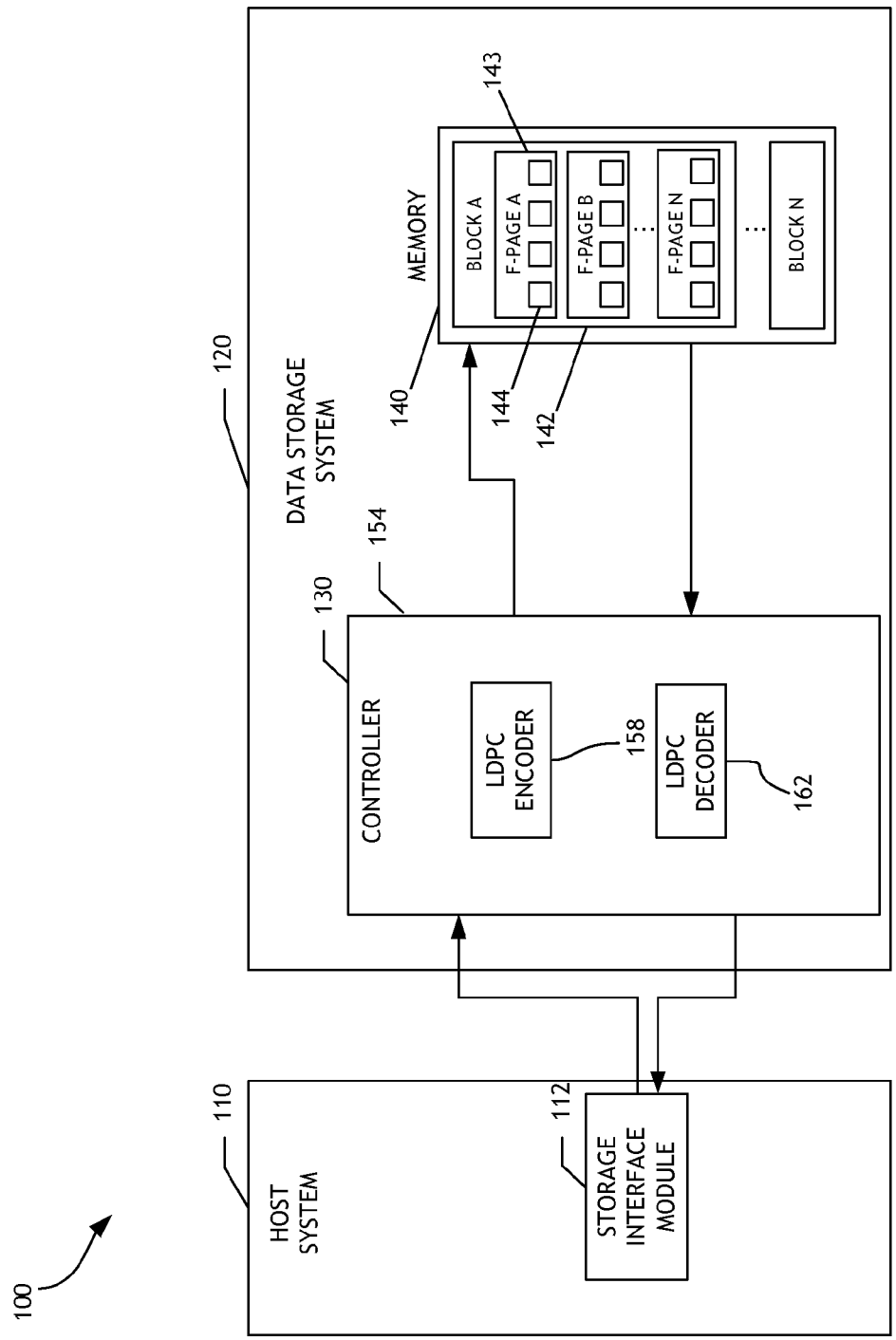
FIG. 1A illustrates a data storage device that dynamically scales soft information such as log-likelihood ratios (LLRs) according to one embodiment of the invention.

FIG. 1A illustrates a data storage device 120 according to one embodiment of the invention. As is shown, a data storage device 120 (e.g., hybrid hard drive, solid state drive, etc.) includes a controller 130 and a memory 140.

The controller 130 can receive data and/or storage access commands from a storage interface module 112 (e.g., a device driver) in a host system 110. Storage access commands communicated by the storage interface 112 can include write and read commands issued by the host system 110. The commands can specify a logical block address in the data storage device 120, and the controller 130 can execute the received commands in the memory 140.

The data storage device 120 can store data received from the host system 110 so that the data storage device 120 can act as memory storage for the host system 110. To facilitate this function, the controller 130 can implement a logical interface. The logical interface can present to the host system 110 storage device memory as a set of logical addresses (e.g., contiguous address) where data can be stored. Internally, the controller 130 can map logical addresses to various physical memory addresses in the memory 140 and/or other memory module(s).

The controller 130 includes an LDPC encoder 158 and LDPC decoder module 162. In one embodiment, the encoder 158 encodes data (e.g., user data) to be written to the memory. For example, data may be written to pages, such as E-pages, of a non-volatile solid-state memory array. The encoder 158 may dynamically use different coding parameters to accommodate changing condition of the memory. Similarly, the decoder 162 decodes data read from the memory pages and can similarly use different coding parameters in the decoding. In other embodiments, the data storage device may use other types of encoders and decoders (e.g., soft decision decoding of Reed-Solomon codes, polar decoders, etc.). For the purpose of illustration, the dynamic scaling mechanism will be described within the context of a LDPC decoder below.

FIG. 1B shows that memory 140 may include a non-volatile solid-state memory array, which comprises one or more blocks of storage, identified as Block "A" 142 through Block "N". Each block comprises a plurality of flash pages (F-pages). For example, Block A 142 of FIG. 1B includes a plurality of F-pages, identified as F-pages A 153, B, through N. In some embodiments, each "F-page" is a smallest grouping of memory cells in the non-volatile solid-state memory array that can be programmed in a single operation or as a unit. Further, each F-page includes a plurality of error correcting code pages (E-pages). In the illustrated embodiment, each F-page includes four E-pages that are illustrated as four boxes, including E-page 144. Other embodiments may use F-pages or E-pages that are defined differently or each F-page may include greater or fewer than four E-pages. FIG. 1C shows that memory 140 may include magnetic media commonly used in hard disk drives, while FIG. 1D shows that memory 140 may include volatile memory such as SRAM or DRAM. In a hybrid hard drive, data may be stored in magnetic media in addition to the non-volatile solid-state memory array.

Dynamic Rescaling

FIG. 2 is a block diagram illustrating the dynamic scaling mechanism in the decoder according to one or more embodiments. As previous described, the LDPC decoder 162 is configured to decode data read from the memory. Those skilled in the art will recognize that FIG. 2 is a simplified, conceptual block diagram showing the components involved in the dynamic scaling of soft information and may thus omit components commonly found in an LDPC decoder.

Decoding of LDPC codes is typically done by an iterative algorithm in which messages indicating bit likelihoods (LLRs) are exchanged between variables and check nodes. The goal is to arrive at a point where the bit values are delineated (e.g., each bit divert to a "0" or "1"). During decoding, these messages are repeatedly added to and subtracted from the LLRs.

As shown in FIG. 2, LDPC decoder 162 includes an iterative unit 202, a trigger unit 204, and a scaling unit 206. The iterative unit 202 is configured to perform iterations of the decoding algorithm using messages, e.g., with each iteration being performed based on the LLRs from a prior iteration in the manner described above.

Decoders are typically based on some fixed-point implementations. In such fixed-point implementations, a common occurrence is the saturation of the output LLRs (and consequently the exchanged messages), which in turn degrades decoder performance, leading to the so-called "error floor" behavior. It has been shown that even as signal-to-noise ratio (SNR) improves, the saturation effect remains.

Some embodiments of the invention overcome such "error floor" behavior by dynamically scaling messages (e.g., output LLRs) during the iterations when certain trigger conditions are met. These trigger conditions may be based on internal states of the decoder and/or monitored decoder-related parameters. In particular, with reference to FIG. 2, the scaling unit 206 is configured to scale messages (e.g., LLRs) from the iterative unit 202 when the trigger unit 204 detects the occurrence of one or more trigger conditions. In one embodiment, the trigger unit is configured to detect one or more trigger conditions based at least in part on one or more inputs received from components within the decoder, with the inputs reflecting one or more internal states of the decoder. The scaled messages (e.g., LLRs) are then used as input to the iterative unit 202 for a next iteration. If no scaling is triggered, the scaling unit 206 acts as a pass through and the LLRs are sent to the iterative unit 202 without scaling. The trigger unit 204 is configured to detect one or more trigger conditions based on one or more inputs received from components within the LDPC decoder. These inputs may reflect one or more internal states of the LDPC decoder.

Figure 3:
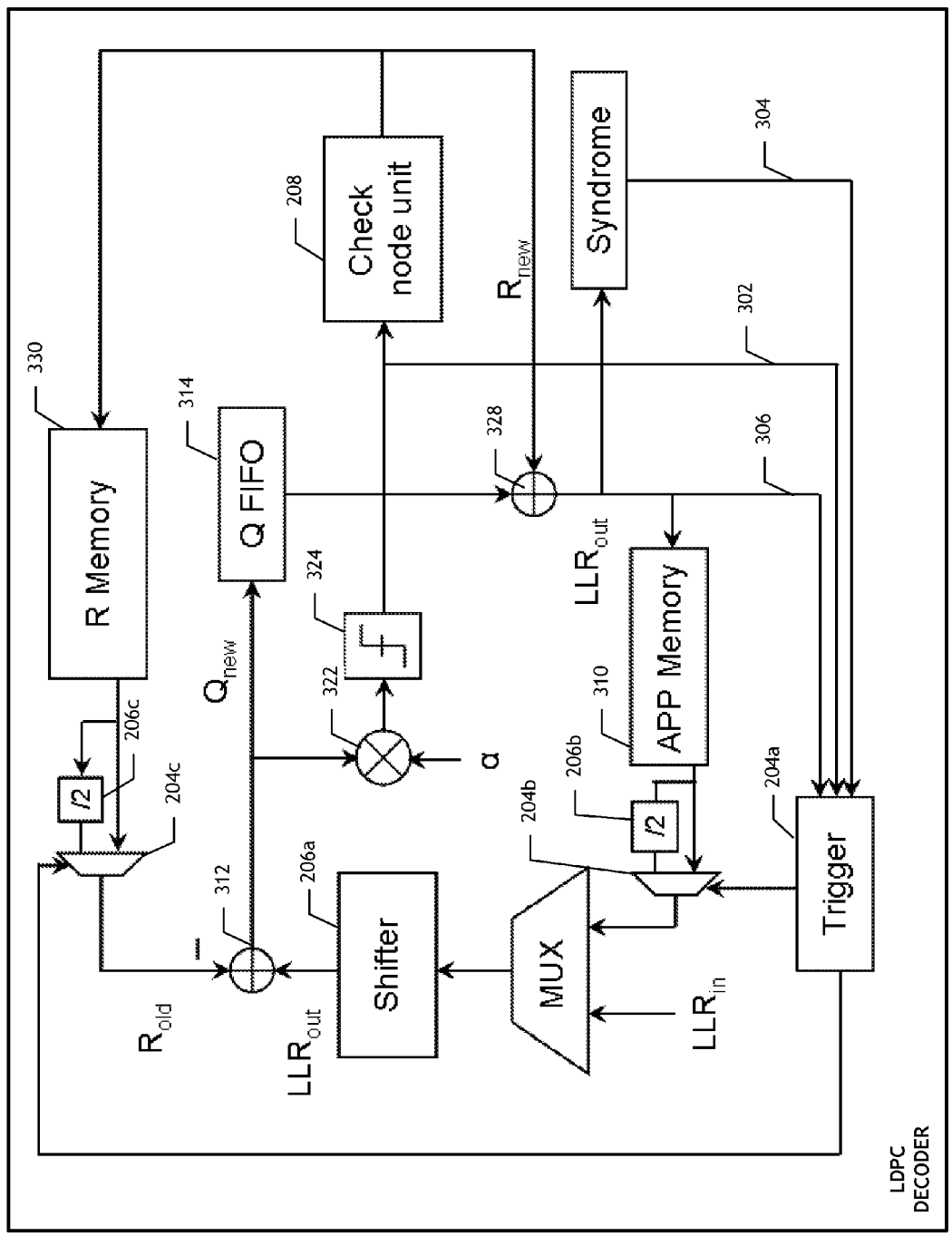
FIG. 3 shows an example decoder with a dynamic scaling mechanism according to one embodiment of the invention.

FIG. 3 shows an example decoder with the dynamic scaling mechanism according to one embodiment of the invention. The example decoder expands upon the simplified representation shown in FIG. 2. The design of the decoder embodiment shown in FIG. 3 is based on a "min-sum" or "sum-product" type decoder. In one embodiment, the decoder is configured to work with a multi-layer parity check matrix, in which case the decoder is a layered decoder.

Like the simplified decoder representation in FIG. 2, in the example LDPC decoder embodiment of FIG. 3 rescaling is also initiated by a trigger unit 204a, which controls multiplexers 204b and 204c. The triggering function in one embodiment is based at least on inputs from one or more sources. As shown, the three example inputs include: (1) messages entering the check-node unit (302), (2) the syndrome of the codeword at the end of each iteration (304), and (3) output LLRs entering the APP (a posteriori) memory (306). Some embodiments may include one or more of the three example inputs and/or other inputs.

In some embodiments, the trigger function uses one or more of the aforementioned inputs to determine if rescaling of the output LLRs and messages is required. Some examples of triggers include:

1) Scale/Rescale if the weight of the syndrome (number of unsatisfied checks) is less than a threshold (the threshold may be optimized for various requirements). In a fixed-point implementation, it has been observed that the saturation problem tends to occur when the weight of the syndrome reaches a low value. In one embodiment, this trigger is delayed until saturation is detected, because it has been observed that a pre-mature triggering based on this condition has an adverse effect on performance, as scaling discards some information that may be important in the early stages of decoding. In one embodiment, the threshold could be in range of 0.1-9.9% of all checks being unsatisfied checks.

2) Scale/Rescale if the number of output LLRs greater than a set limit is more than a threshold. In one embodiment, if the absolute values of a predetermined number of LLRs are greater than a set limit, the trigger condition is met and the LLR values are scaled down.

3) Scale/Rescale if the number of messages that are saturated is greater than a threshold. In one embodiment, this is based on the input to the check node unit (which translates to the input 302 to the trigger unit 204).

4) Scale/Rescale if a preset number of iterations is reached. In one embodiment, the decoder could be configured to trigger rescaling when a preset number of iterations is reached (e.g., 5). In another embodiment, a preset minimum number of iterations has to be performed before a rescaling can occur.

5) Rescale if the number of iterations since the last rescale has reached a threshold. It has been observed that after a scaling, it is beneficial to allow a certain number of iterations to occur before another scaling is performed. So in one embodiment, there is a minimum number of iterations required following a previous rescaling before a rescaling can take place.

6) Any conditions that are compounds of the above conditions. This could be, e.g., scale/rescale if (i) the weight of the syndrome <15, AND (ii) the last rescaling (if it happened) was done more than 5 iterations before.

In the decoder embodiment of FIG. 3, the scaling unit 206 includes a shifter 206a. When the trigger function detects a condition that triggers scaling, the shifter 206a in one embodiment is configured to right shift (with rounding or truncating) the LLR ($LLR_{out}$) coming from the APP Memory 310. The right shifting, when followed by truncation or rounding, reduces the numerical range spanned by the LLR, thereby reducing the number of bits required to represent it. Note that in the first iteration, the initial $LLR_{in}$ may come from a detector such as a Soft-Output Viterbi Algorithm (SOVA) detector into multiplexer 320 and is selected for use. The scaled $LLR_{out}$ is then sent to adder 312, where $R_{old}$ (prior messages stored in R memory 316) is subtracted from it, and the result is sent to Q FIFO 314, as well as an alpha multiplier 322 and a threshold 324. In one embodiment, the alpha value of the alpha multiplier 322 is a fixed value that is used to adjust the LLRs for performance reasons and the threshold 324 is used for rounding operation after the alpha multiplier is applied, so that the output after the alpha multiplier application maintains the same number of bits or has a fewer number of bits.

In one embodiment, at each iteration, the check node unit 208 receives inputs from the variable nodes and sends an update to each variable node. The function of the R Memory loop (marked by adder 312 and adder 328) is to screen out certain updates to the check nodes, such that a check node does not receive its own update. The R Memory itself (330) stores the update from the prior iteration out of the check node unit 208 ($R_{new}$). To accomplish this, in one embodiment $R_{new}$ from the check node unit 208 is added to the $LLR_{out}$ at the current iteration (at adder 328) and $R_{old}$ (which is $R_{new}$ from a prior iteration) is subtracted from the $LLR_{out}$ at the next iteration (at adder 312). In other embodiments, the R Memory loop may be implemented in a different manner to accomplish the same goal.

At each iteration, the layers of the parity check matrix are processed one layer at a time. For the purpose of this disclosure, the processing of each layer will be referred to as a sub-iteration. In one embodiment, after the last sub-iteration on the last layer, the APP Memory 310 contains the output LLRs from a full iteration. The following example illustrates the scaling operation. Let:

i denotes the current iteration;

l denotes the current sub-iteration (the current layer being processed); and i.l denotes the i th iteration and the l th sub-iteration.

Assume that there are four layers in the matrix, and the i and l indices start at 1 instead of 0. In one embodiment, the decoder starts by processing through sub-iterations 1.1, 1.2, 1.3, and 1.4. At the end of sub-iteration 1.4, the trigger unit may decide that a condition for scaling is met and trigger the scaling. It will scale the output of the APP Memory 310 and the output of the R Memory 330. This is accomplished at sub-iteration 2.1 through control of the multiplexers 204b and 204c. At sub-iterations 2.2, 2.3, and 2.4 the multiplier 204c is configured so that output of the R Memory 330 will continue to be scaled to ensure that outputs from previous layers are also scaled, but the multiplier 204b is otherwise configured to not scale the output of the APP Memory 310. Once the iteration/sub-iteration 2.4 ends, then both scaling will be turned off (assuming a trigger condition is not present again). In one embodiment, the decision to turn on the scaling is made at the end of each iteration i, and once the scaling decision is triggered, scaling of the APP Memory outputs is performed as the LLR enters the first sub-iteration of the next iteration (i+1) as it begins, and the scaling of the R Memory outputs are performed during each sub-iteration of iteration i+1.

Figure 4:
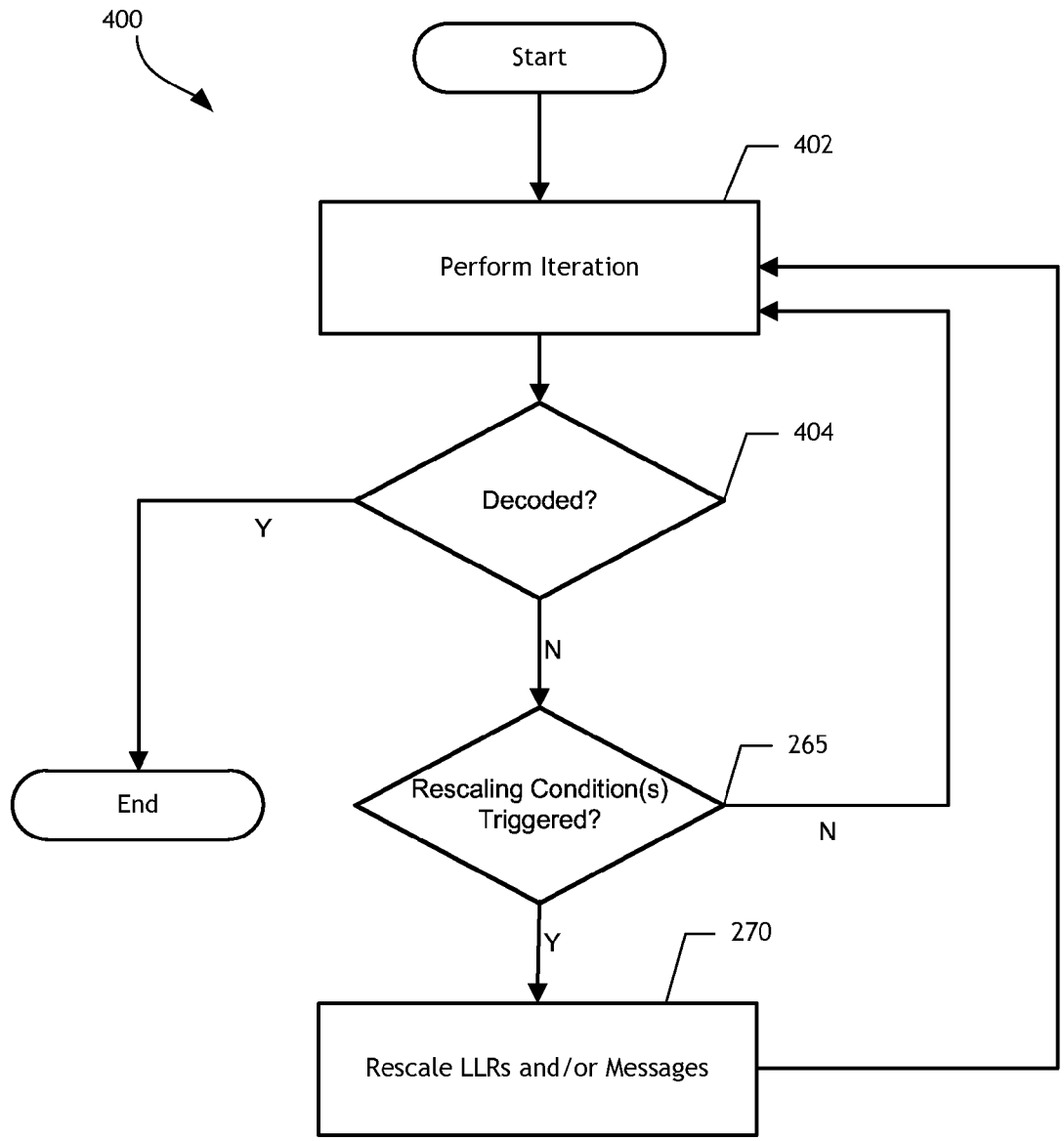
FIG. 4 is a flow diagram illustrating a process of dynamic scaling according to one embodiment of the invention.

FIG. 4 is a flow diagram illustrating a process 400 of dynamic scaling according to one embodiment of the invention. The process starts at block 402 where a decoding iteration is performed. This may be a part of performing several iterations of decoding by using messages, as described above. Then a detection/check at 404 is performed to determine if the decoding is complete. If so, the decoding process terminates. Otherwise, a check of the rescaling conditions is performed at block 406 to determine if the rescaling is triggered. The detecting of one or more trigger conditions could be based at least in part on one or more inputs received from components within the decoder, the inputs reflecting one or more internal states of the decoder. The various trigger conditions include those described above. If the occurrence of the one or more trigger conditions is detected in a current iteration, the messages are scaled/rescaled at block 408 and the next iteration is performed at block 402 with the scaled messages as input. If the rescaling has not been triggered the LLRs and messages are passed into the next iteration without scaling.

Other Variations

Those skilled in the art will appreciate that in some embodiments, other approaches and methods can be used. For example, although the example embodiments are described in the context of an LDPC decoder, the embodiments are applicable to iterative decoders other than LDPC decoders such as soft decision decoding of Reed-Solomon codes, polar decoders, etc. As another example, the non-volatile solid-state memory array can be implemented using NAND flash memory devices. Other types of solid-state memory devices can alternatively be used, such as array of flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), other discrete NVM (non-volatile solid-state memory) chips, or any combination thereof. In one embodiment, the non-volatile solid-state memory array preferably includes multi-level cell (MLC) devices having multi-level cells capable of storing more than a single bit of information, although single-level cell (SLC) memory devices or a combination of SLC and MLC devices may be used. In one embodiment, the data storage device 120 can include other memory modules, such as one or more magnetic memory modules.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware.

Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A device, comprising:
   a decoder configured to decode data read from a memory, the decoder comprising:
   an iterative unit configured to iterate using a plurality of messages;
   a trigger unit configured to detect one or more trigger conditions based at least in part on one or more internal states of the decoder; and a scaling unit to scale messages output by the iterative unit when the trigger unit detects the occurrence of the one or more trigger conditions, the scaled messages being used as input to the iterative unit for a next iteration.

2. The device of claim 1, wherein the messages comprise one or more of:
- a scalar representing an estimated reliability of a single unit of data; and
- a vector representing an estimated reliability of a single unit of data.

3. The device of claim 1, wherein the messages comprise log likelihood ratios (LLRs).

4. The device of claim 3, wherein the scaling unit comprises a shifter to right shift and truncate the LLRs.

5. The device of claim 3, wherein scaling unit comprises a shifter to right shift and round the LLRs.

6. The device of claim 1, wherein:
- the decoder further comprises a first memory and a second memory, and
- the decoder is configured to work with a parity check matrix including a plurality of layers;
- the trigger unit in configured to:
  - trigger scaling of an output from the first memory at a sub-iteration associated with processing a first layer of the plurality of layers; and
  - trigger scaling of an output from the second memory at sub-iterations associated with processing of the first layer and one or more of the plurality of layers other than the first layer.

7. The device of claim 1, wherein the one or more internal states comprises one or more of:
- a weight of a syndrome;
- a number of messages from a current iteration whose values exceed a threshold limit;
- a number of messages that are saturated in a current iteration;
- a number of iterations already performed; and
- a number of iterations performed since a last rescale.

8. The device of claim 7, wherein the one or more internal states comprises a combination of two or more of:
- a weight of a syndrome;
- a number of messages from a current iteration whose values exceed a threshold limit;
- a number of messages that are saturated in a current iteration;
- a number of iterations already performed; and
- a number of iterations performed since a last rescale.

9. The device of claim 1, wherein the decoder further comprises a check node unit configures to determine whether one or more parity check conditions have been satisfied, so that iterations performed by the iterative unit can be terminated.

10. The device of claim 1, wherein the decoder comprises a low density parity check (LDPC) decoder.

11. The device of claim 1, further comprising an encoder to encode data to be written to a memory.

12. The device of claim 11, wherein the encoder comprises an LDPC encoder.

* * * * *